(12) United States Patent
Heismann

(10) Patent No.: US 9,581,664 B2
(45) Date of Patent: Feb. 28, 2017

(54) CONTROL OF A PRESSURE OF A LOCAL COIL IN RELATION TO AN OBJECT UNDER EXAMINATION

(71) Applicant: Björn Heismann, Erlangen (DE)

(72) Inventor: Björn Heismann, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 747 days.

(21) Appl. No.: 13/945,856

(22) Filed: Jul. 18, 2013

(65) Prior Publication Data
US 2014/0021949 A1   Jan. 23, 2014

(30) Foreign Application Priority Data
Jul. 19, 2012   (DE) .................. 10 2012 212 692

(51) Int. Cl.
*G01V 3/00* (2006.01)
*G01R 33/34* (2006.01)

(52) U.S. Cl.
CPC ....... *G01R 33/34* (2013.01); *G01R 33/34007* (2013.01); *G01R 33/34084* (2013.01)

(58) Field of Classification Search
USPC ........................................... 324/307
See application file for complete search history.

(56) References Cited

U.S. PATENT DOCUMENTS

| | | | |
|---|---|---|---|
| 5,400,787 A | 3/1995 | Marandos | |
| 5,490,513 A | 2/1996 | Damadian et al. | |
| 5,706,813 A * | 1/1998 | Filler | G01R 33/34 324/318 |
| 5,924,987 A | 7/1999 | Meaney et al. | |
| 5,945,827 A * | 8/1999 | Gronauer | A61B 5/0555 324/318 |
| 6,684,096 B2 * | 1/2004 | Schmit | A61B 6/0442 128/845 |
| 6,882,878 B2 | 4/2005 | Schmit et al. | |

(Continued)

FOREIGN PATENT DOCUMENTS

| | | |
|---|---|---|
| DE | 200 09 909 U1 | 8/2000 |
| EP | 0730164 A1 | 9/1996 |

(Continued)

OTHER PUBLICATIONS

German Office Action dated Apr. 15, 2013 for corresponding German Patent Application No. DE 10 2012 212 692.9 with English translation.

(Continued)

*Primary Examiner* — Rodney Fuller
(74) *Attorney, Agent, or Firm* — Lempia Summerfield Katz LLC (57) ABSTRACT

A local coil system for a magnetic resonance imaging system and a magnetic resonance imaging system include a local coil. The local coil includes a pressure element that may be filled with a fluid, and a controllable fluid supply device that at least at the imposition of the local coil to the object under examination and/or during the operation of the local coil, is coupled to the pressure element. The controllable fluid supply device is embodied such that the pressure of the pressure elements attained with the aid of the fluid, imposed on the object under examination may be changed, at least area by area.

19 Claims, 7 Drawing Sheets

(56) References Cited

U.S. PATENT DOCUMENTS

| | | | |
|---|---|---|---|
| 7,515,951 B2* | 4/2009 | Egan | G01R 33/34076 |
| | | | 128/845 |
| 2002/0079898 A1* | 6/2002 | Van De Spijker | A61B 5/0555 |
| | | | 324/318 |
| 2004/0127786 A1 | 7/2004 | Schmit et al. | |
| 2005/0080332 A1 | 4/2005 | Shiu et al. | |
| 2005/0080333 A1 | 4/2005 | Piron et al. | |
| 2006/0173390 A1* | 8/2006 | Van Wyk | A61B 6/0421 |
| | | | 602/6 |
| 2006/0293590 A1 | 12/2006 | Egan et al. | |
| 2009/0012389 A1* | 1/2009 | Kundner | G01R 33/28 |
| | | | 600/422 |
| 2013/0162252 A1* | 6/2013 | Heid | G01R 33/34084 |
| | | | 324/318 |
| 2014/0039301 A1* | 2/2014 | Driemel | G01R 33/34084 |
| | | | 600/422 |

FOREIGN PATENT DOCUMENTS

| | | | |
|---|---|---|---|
| JP | 2009011837 A | 7/2008 | |
| WO | WO 01/91642 A1 | 12/2001 | |

OTHER PUBLICATIONS

Office action for Related Chinese Application No. 201310305887.0 dated Dec. 29, 2015 with English Translation.
Notice of Allowance for related Korean Application No. 10-2013-0084895, mailed Feb. 5, 2016, with English Translation.
Korean Office Action for Korean Application No. 10-2013-0084895, dated May 10, 2015, with English Translation.

* cited by examiner

CONTROL OF A PRESSURE OF A LOCAL COIL IN RELATION TO AN OBJECT UNDER EXAMINATION

OBJECT UNDER EXAMINATION

This application claims the benefit of DE 10 2012 212 692.9, filed on Jul. 19, 2012, which is hereby incorporated by reference.

BACKGROUND

The present embodiments relate to a local coil.

Imaging systems that are based on a method of magnetic resonance measurement (e.g., of nuclear spin; magnetic resonance tomography) may be used for a wide range of applications. With this type of image acquisition, a powerful static basic magnetic field $B_0$ is used for the initial alignment and homogenization of magnetic dipoles that are to be examined. For the determination of material properties of an object of examination that is to be imaged, the dephasing or relaxation time is determined after a deflection of the magnetization out of the initial alignment, such that various different material-typical relaxation mechanisms or relaxation times may be identified. The deflection may be attained via a number of HF pulses using an HF transmitter device of the magnetic resonance imaging system. A suitable measurement of the magnetization at the particular moment of the object under examination for the determination of the material-typical relaxation times and material-typical properties is effected with the aid of receiver coils that are matched to the material-typical properties. In order to improve the quality of the magnetic resonance recording, it is advantageous for these receiver coils to be arranged in the immediate vicinity of the object under examination or of a patient or test subject. Such receiver coils or transmitter coils, which are arranged in the immediate vicinity of the object under examination, are known by the term "local coils".

In order to obtain the advantages of being located close to the object such as, for example, a favorable signal-to-noise ratio, the relative position of the local coil in relation to the object under examination during a recording sequence is to be determined in a defined manner.

By way of example, various fixing mechanisms are known, such as tension bands and the like, which make possible the fixation of the local coils in relation to the patient (e.g., the test subject). For example, a local coil may be fixed on or around a wrist, a knee, or the like. Because the local coil may only be adapted to a certain degree to the object under examination, additional wedge elements or foam inlays may be used in order to retain the local coil in a specifically determined position in relation to the object under examination. This vastly delays the sequence of operational steps for the acquisition of magnetic resonance images, as well as being unpleasant for the test subject.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved possibility for determination of a position of a local coil in relation to an object under examination is provided.

One embodiment of a local coil system for a magnetic resonance imaging system includes at least one local coil (e.g., body coils or joint coils). The local coil includes a pressure element that may be filled with a fluid (e.g., for the exerting of pressure on the object under examination). The pressure element may be configured, for example, as a cushion or an apparatus similar to a cushion The local coil system also includes a controllable fluid supply device that at least at the initial placement of the local coil to the object under examination, or during the operation of the local coil, is coupled to the pressure element. The fluid supply device is configured such that the pressure of the pressure element onto the object under examination attained with the aid of the fluid may be changed at least area by area. In other words, the pressure generated onto the object under examination with the aid of the filling pressure of the pressure element may be varied at least area by area or section by section over the surface of the local coil facing towards the object under examination, such that, for example, blood vessels are not pressed too hard or crushed. With the aid of one or more of the present embodiments, a uniform imposition pressure of the local coil may be exerted onto the object under examination. For example, pressure peaks (e.g., locally prominent pressure maxima) may be avoided, such as may occur, for example, by the use of foam material wedges or the like.

One or more of the present embodiments therefore make it possible, in an advantageous manner, for the position of the local coil to be set in relation to the object under examination, and, at the same time, to bring about a pleasant appreciation of the local coil by the test subject.

A local coil for such a local coil system accordingly includes at least one pressure element capable of being filled with a fluid. The at least one pressure element is configured such that the pressure attained with the aid of the fluid imposed on the object under examination may be changed at least area by area. In this situation, the pressure on the object under examination is determined, for example, by the changeable filling pressure of the pressure element. A fluid supply device may be an internal part of the local coil. Alternatively, the fluid supply device may be connected to the local coil externally.

A method for the generation of magnetic resonance images includes positioning a local coil that exhibits a pressure element capable of being filled with a fluid relative to the object under examination. The positioning includes changing the pressure of the pressure element attained by the fluid at least area by area.

A magnetic resonance imaging system that includes a local coil system or a local coil is also provided.

In one embodiment, a magnetic resonance imaging system includes a fluid control device. The fluid control device is configured for the control and/or regulation of the pressure of a fluid in a local coil. For example, the pressure may be varied in one or a plurality of pressure elements of the local coil with the aid of the fluid control device. In addition to a separate arrangement of the fluid control device, the fluid control device may also be integrated into a central control device (e.g., a central control unit or a central controller) of a magnetic resonance imaging system.

The fluid control may, for example, be synchronized with the control of a recording sequence for the acquisition of magnetic resonance recordings. In other words, at fixed points in time, which are determined in relation to the recording sequence, the pressure of the fluid is adjusted to a predetermined value, or other control or regulation acts may be carried out by the fluid control device at these points in time. The control or regulation acts may be, for example, the regulation of the temperature of the test subject. The fluid supply of the local coil may therefore be effected using a fluid supply device that may be regulated or controlled (e.g., remotely controlled).

Accordingly, with a method according to one or more of the present embodiments for the control and/or regulation of the pressure of a local coil of a magnetic resonance imaging system in relation to an examination object, a pressure imposed onto the object under examination may be changed with the aid of a fluid. The pressure of the fluid in a local coil is changed by a pressure element filled with the fluid.

Further advantageous embodiments and developments are derived from the following description. The description relating to a category may also be further developed by analogy to the description of another category.

In one embodiment, the fluid supply device of the local coil system is configured such that the filling pressure of the pressure element may be changed during the operation of the local coil in the specified manner. This makes possible, for example, the automatic variation of the position of the object under examination with the aid of the pressure element or the local coil, respectively.

The fluid may be a gas (e.g., air) or a liquid medium (e.g., incompressible). If air is used, this has the advantage that the air may be made available with little effort (e.g., using the compressed air supply already present).

If the fluid is a largely incompressible liquid medium, then a higher degree of form stability of the pressure element is thereby attained. Water or oils may be used. Water or oils may also provide a high heat capacity. This provides that the heat capacity may, for example, be greater than 75.3 J/Mol/° C. A cooling or temperature regulation, respectively, of the object under examination may thus be achieved in the region of the local coil or, respectively, in the region of the surface of the local coil in order to provide the object under examination with optimum ambient conditions and maintain the optimum ambient conditions during the magnetic resonance imaging, or, depending on the material that is to be examined and/or the problem underlying the examination that relates to the object under examination, to specify a temperature that is maintained with the aid of the fluid.

In one embodiment, the local coil includes several pressure elements, so that an excellent adaptation to complicated shapes of an object under examination may be attained. The fluid supply for the pressure elements may herewith be effected, for example, via a common fluid line. In one embodiment, the pressure elements are combined to form one common pressure body. For example, this may be an arrangement of connected pressure cushions, of which the volume is in each case perceptibly greater than the volume of the connection lines between the chambers. The pressure chambers may be arranged in a cassette or matrix structure.

In one embodiment, the local coil system may be configured such that the pressure elements are operated at least partially with a filling pressure that differs from one another in each instance. For example, separate fluid lines may be provided for individual or a plurality of pressure elements (e.g., for each of the pressure elements separately).

In one embodiment, pressure adjustment devices such as, for example, overpressure valves, pressure regulators, choke valves, or the like may be used in order to adjust the filling pressure of two pressure elements or of two groups of pressure elements in each case differently from one another. Accordingly, for example, one individual common supply line, into which one or more pressure adjustment devices may be integrated, may be used for several pressure elements, excellent adaptation capability to the shape of the object under examination may also be attained, and excellent fixing of the local coil may be provided.

In a further embodiment, when the local coil is being operated in the appropriate manner, essentially the whole of the surface of the local coil that is facing the object under examination is covered by the pressure element or pressure elements respectively. In other words, the pressure in relation to the object under examination is, for example, changeable essentially over the whole of the surface of the local coil that is facing the object under examination. Essentially, at least 50% (e.g., at least 70% or at least 90%) of the surface of the local coil facing towards the object under examination may be varied in a contact pressure in relation to the object under examination.

The surface of the local coil facing towards the object under examination may, however, also include one or a plurality of defined areas that may not be varied in contact pressure with the aid of pressure elements. Thus, for example, areas that are located, for example, in the vicinity of vessels or arteries that may then, for example, be pinched due to the pressure of the pressure element may be exempted. The areas of the surface of the local coil facing the object under examination that are covered with the aid of the pressure elements allow for a largely uniform distribution of pressure in relation to the object under examination, such that pressure peaks may be avoided.

The local coil system may include a fluid drain device that may, for example, be coupled to a switch element. With the fluid drain device, a rapid emptying of the fluid from the pressure element or elements may be effected. Rapid emptying provides that the emptying of the pressure element or elements may take place more rapidly than filling. For example, this provides that the fluid flow in a corresponding drain line or through the drain device is more rapid than the fluid flow in a fluid feed or fluid feed line with the same fluid pressure. For example, the drain line may exhibit a larger diameter than the fluid feed line. In one embodiment, the operation of the local coil may be optimized, such that, after the examination has been carried out, the local coil may be rapidly removed from the object under examination. In addition to this, however, in an emergency situation, an almost instantaneous removal of the local coil from the object under examination may be carried out if a situation arises that requires the immediate removal of the local coil from the object under examination.

In one embodiment, the local coil system includes a pressure measuring device for measuring the filling pressure of the pressure element and/or for measuring the pressure exerted with the aid of the pressure element onto the object under examination. The adaptation to a complicated form of the object under examination may thus be provided under a uniform or specified pressure distribution. The pressure may be exerted onto the object under examination only within specified pressure limits, such that it is possible to reliably prevent the object under examination from becoming excessively stressed by the pressure element.

This may also be provided, for example, with the aid of pressure regulating or controlling devices such as, for example, pressure regulating valves or pressure limiting valves that may also be allocated individually to one of a plurality of pressure elements.

In one embodiment, the local coil includes, in addition to the pressure element and the other usual components used for the reception of a magnetic resonance signal such as, for example, a magnetic resonance antenna, a coil body. The pressure element may be connected to the coil body, indirectly or directly (e.g., in a reversibly detachable manner). The coil body may, for example, be configured as a single piece or multi-piece (e.g., multi-part half-shells or shells) that surround an object under examination at least partially (e.g., completely in a circumferential direction). In other words, the coil body may essentially follow the form of the object under examination. Accordingly, only minor adaptations to the form of the object under examination are provided with the aid of the pressure elements in order to determine a defined position of the local coil in relation to the object under examination. The local coil may therefore be secured extremely rapidly to the object under examination and may be extremely rapidly released again. For example, this may be done automatically, for example, due to the presence of pressure regulators that are configured for the regulation of the filling pressure of the pressure elements or, respectively, for the regulation of the pressure of the local coil in relation to the object under examination. Accordingly, it may be provided, almost fully automatically, that the local coil may be fixed rapidly and easily to or in the vicinity of the object under examination and may be released again in a similar manner from the object under examination.

In order to further improve the operation of the local coil, the local coil may include an emptying reservoir for the emptying of the fluid from the pressure element. In one embodiment, the emptying reservoir is arranged in the region of the side of the local coil that faces away from object under examination. Accordingly, for example, the accelerated emptying of an incompressible fluid may be achieved without high pressures being conveyed over extensive distances.

The local coil may also include the controllable fluid supply device. "Controllable" may be an automatic controlling and manual controlling (e.g., in the form of bellows). The fluid supply device may be arranged secured to or in the region of the local coil, or even, for example, integrated into the local coil. For example, at least valves of the fluid supply device may be integrated into the local coil, while, for example, a manual bellows may be connected to the integrated valve in a reversibly detachable manner.

The local coil may therefore include only one connection for a fluid supply device, while the other devices (e.g., the fluid supply device) are arranged externally to the local coil. In all these cases, the controllable and/or regulatable fluid supply device may be configured for the supply of the local coil with a fluid for changing the temperature of the fluid. For example, the fluid supply device may include a cooler or a heating device for the fluid. In addition, the fluid supply device may also include at least in part a temperature regulating apparatus for the fluid. It may therefore be provided that the object under examination will not be overly stressed by temperature influences during the magnetic resonance imaging, or, in addition, certain specific material properties of the object under examination may be examined in a temperature-dependent manner.

In one embodiment, the magnetic resonance imaging system and, for example, the fluid control device may be configured such that the operation of the local coil takes place on the basis of several different profiles with different regulation and/or control characteristics for the control and regulation of the fluid supply of the local coil. For example, a choice may be made between different profiles (e.g., as a function of the respective object under examination) of the material to be examined, of the application behind the examination, or of an examination protocol. In one embodiment, the local coil may be arranged differently with the aid of the pressure element(s) in the vicinity of the object under examination, such that different recordings may be selected as a function of the particular examination in each case.

This is advantageous for a method for generating magnetic resonance images, in which the position and/or the temperature of the object under examination varies between two recording sequences and/or during one recording sequence with the aid of the local coil. In one embodiment, this may be a joint coil that, with the aid of different profiles, is actuated such that a joint (e.g., a knee joint or wrist joint) is varied between two different angle settings with the aid of the local coil. In one embodiment, easy registration (e.g., local allocation to a reference point) of different magnetic resonance images may be attained.

BRIEF DESCRIPTION OF THE DRAWINGS

The same components in the different figures are provided with the same reference numbers.

DETAILED DESCRIPTION

Figure 1:
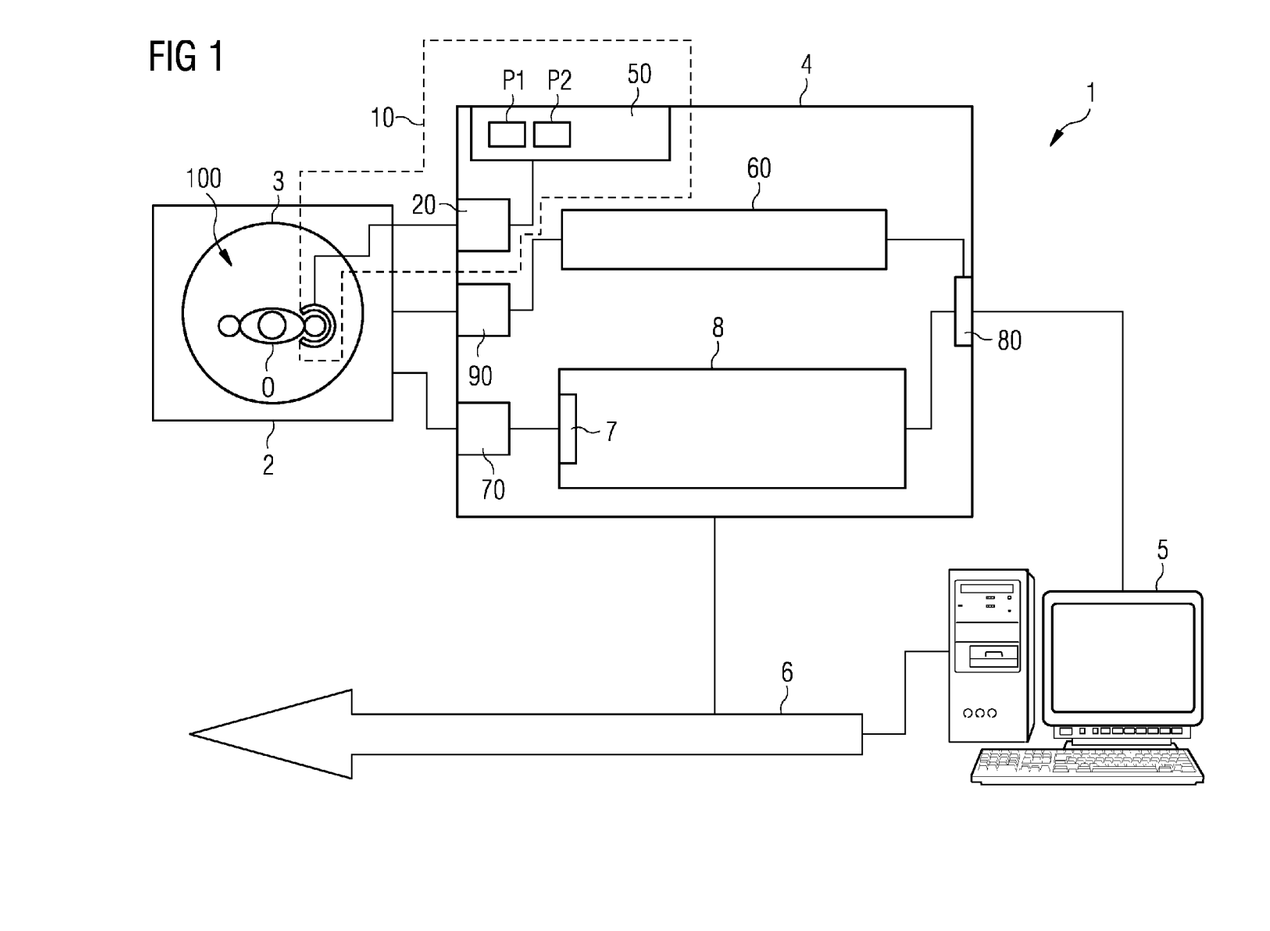
FIG. 1 shows an exemplary embodiment of a magnetic resonance imaging system.

Represented schematically in FIG. 1 is a magnetic resonance imaging system 1 (e.g., an MR-system) with a reconstruction device 8. The MR-system 1 includes a conventional MR-scanner 2, in which a patient couch (not shown) is accommodated in an examination tunnel 3. An object under examination O, such as a patient or test subject, may be positioned on the patient couch.

The scanner 2 and the patient couch are actuated by a controller 4. The controller may be a conventional central control computer 4 (e.g., a control unit). The central control computer 4 is equipped with an appropriate control interface 90 and a measurement control unit 60. This measurement control unit 60 controls the scanner 2 in accordance with a prescribed measurement protocol for the conducting of a measurement.

The control interface 90 is only represented in FIG. 1 as a block. It is clear, however, that with a technical medical system, this interface 90 includes a plurality of individual interfaces. The plurality of individual interfaces includes, for example, interfaces for the actuation of the gradient system and a high-frequency transmission system for the transmitting of high-frequency pulses. The control interface 90 also includes an interface for transferring control signals to the patient couch.

The raw MR data acquired by the scanner 2 is taken over by the control computer 4 via a reception interface 70. The interface 70 may also include several part interfaces. The raw data is passed via a raw data interface 7 to the reconstruction device 8 that reconstructs image data therefrom. The image data is then, for example, displayed on a screen of a terminal 5 locally and/or deposited in a memory and/or transferred via a network interface to a databus 6. The imaging system 1 is connected to other facilities within a network using the databus 6 in order, for example, for measurement data or finished reconstructed image data to be deposited in large mass memories or transferred to findings stations or the like, for example.

The actuation of the entire MR system 1 by an operator is carried out via the terminal 5, which is connected via a terminal interface 80 to the central control computer 4. With the aid of the terminal 5 and a user interface located at the terminal 5, the operator may, for example, respectively select or adapt a measurement protocol from a memory (not shown) and provide that the measurement control unit 60 emits, on the basis of the protocol, corresponding control signals via the control interface 90 to the scanner 2, such that the measurement may be carried out.

The central control computer 4 may not be configured as represented in FIG. 1 as an integral unit. Alternatively, the central control computer 4 may also be formed from a plurality of separate units that are interlinked with one another in a suitable manner. A large number of components may also be realized in the form of software (e.g., jointly with other components on one or more computer units (e.g., microcontrollers) that belong to the control unit 4). For example, the reconstruction device 8 may also exist outside such a central actuation unit for the actuation of the scanner 2. In this case, the raw data is transferred, for example, directly via a network to the reconstruction device 8. In addition, the image reconstruction device may be a part of the terminal 5, provided that the terminal 5 exhibits a suitable computing capacity.

The central control computer 4 and the scanner 2 may include a plurality of further components of a magnetic resonance system. All these components and the basic manner of function of such imaging systems are known to the person skilled in the art, however, and therefore do not need to be explained in any greater detail.

In addition to these components of the magnetic resonance imaging system 1, the controller in the exemplary embodiment according to FIG. 1 exhibits a fluid supply device 50 for the supply of the local coil 100 with a fluid. The fluid supply device 20 is actuated by a fluid control device 50. The fluid control device 50 may, on the basis of one or more profiles P1, P2, control and/or regulate the fluid supply of the local coil by remote control of the fluid supply device 20.

Notwithstanding the exemplary embodiment represented, the fluid control device 50 may also be configured as integrated into the fluid supply device 20.

The local coil system 10 in FIG. 1 includes a local coil 100, only indicated in schematic form, for the transmission of HF pulses and, respectively, for the receiving of magnetic resonance signals of the object under examination O. Going beyond the representation in FIG. 1, a local coil system is described hereinafter more precisely, on the basis of FIGS. 2 to 4.

Figure 2:
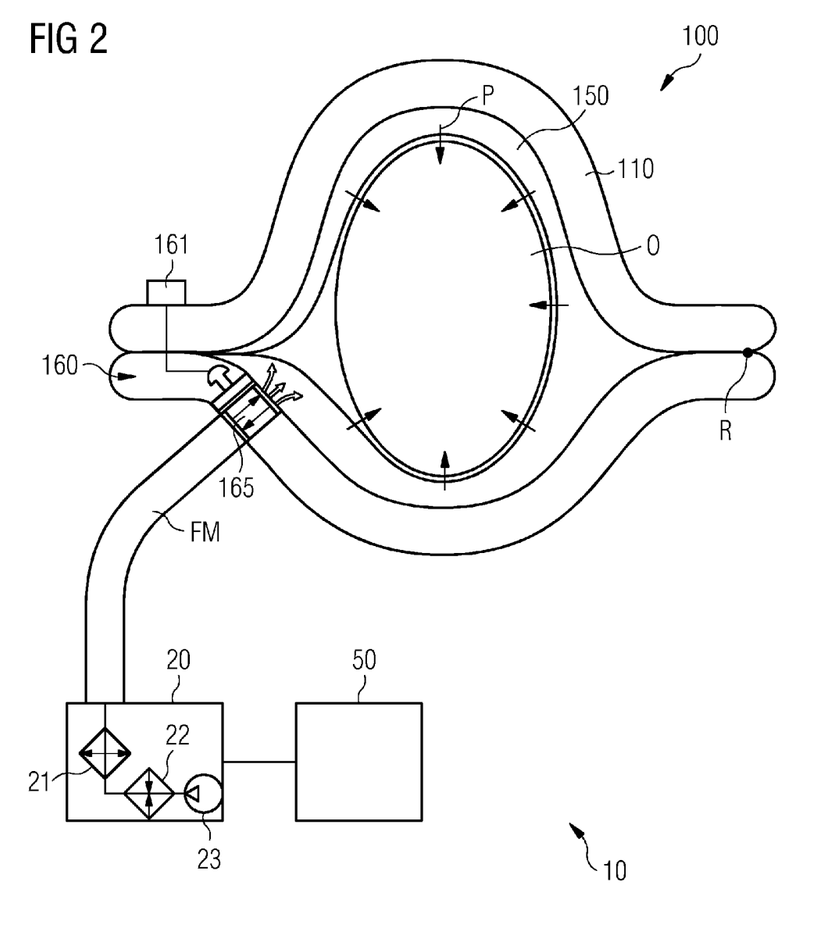
FIG. 2 shows an exemplary embodiment of a local coil system with a fully automatic fluid supply device.

FIG. 2 shows one embodiment of a local coil system 10 with a local coil 100 that includes a two-shell coil body 110. The half-shells of the coil body 110 are, for example, rotatably mounted about an axis of rotation R, such that the half-shells of the coil body 110 may both be opened in relation to one another such that an object under examination O may be introduced between the two shell halves. The object under examination O is surrounded entirely by the coil body 110 in a circumferential direction in relation to a plane of intersection running through the object under examination O.

The object under examination O in the example in FIG. 2 is an arm of a test subject. A pressure P is exerted onto the arm with the aid of a pressure element 150 that is connected to the coil body 110 at an inner wall of the coil body 110. The pressure P, for example, is adjustable by a fluid pressure inside the pressure element 150. The pressure element 150 is, for example, connected to a fluid supply device 20 via a valve 165 that is integrated into the coil body. The valve 165, which forms an actuator for the fluid supply, is a two-way valve 165. As an alternative, however, other actuators may also be provided for the fluid supply, such as, for example, a check valve, a non-return valve, a pressure valve, or a shutoff valve.

In the exemplary embodiment of FIG. 2, the two-way valve 165 is in part a constituent element of a fluid drain device 160 that is configured, by a switch element 161, to empty the fluid FM rapidly from the pressure element 150. To do this, the fluid drain device 160 (e.g., the two-way valve 165) is configured such that a drain line has a greater diameter than an inflow line for the fluid FM, such that, as appropriate, the fluid may flow more quickly out of the pressure element 150 than the fluid may be conducted in.

The pressure element 150 surrounds the object under examination O almost completely in a circumferential direction. This allows for the formation of pressure peaks to be largely avoided and for a uniform pressure to be exerted on the object under examination O. This pressure provides that a secure fixing of the local coil 100 is to be provided even with complicated forms of the object under examination O, such that high-quality magnetic resonance images with an optimum signal-to-noise ratio may be produced.

The pressure of the fluid FM in the pressure element 150 and therefore the pressure P onto the object under examination O is produced with the aid of a fluid supply device 20. For this purpose, the fluid supply device 20 includes a pump 23 or pump facility. In one embodiment, the pump 23 is a bellows pump, a piston pump (e.g., a rotary piston pump), a diaphragm pump, a micro pump (e.g., a micro diaphragm pump), or also a fluid reservoir or, respectively, a connection to a fluid system (e.g., not shown; an already existing compressed air system) that is under an overpressure in relation to the surroundings and under a maximum pressure that is permissible for the pressure element 150. The fluid FM moved by the pump 23 in the direction of the local coil 100 may be heated by a heating device 22 or cooled with the aid of a cooler 21. The cooler 21 and the heating device 22 may, for example, also be arranged in combination. Due to the cooler 21 and the heating device 22, with the aid of the fluid FM, the patient or the object under examination O may be kept at a constant temperature, or a predetermined temperature variation may be carried out during a magnetic resonance recording sequence or, respectively, between two recording sequences. The local coil system 10 may, for example, be configured such that the fluid FM is continuously moved in a circulatory fashion between the fluid supply device 20 and the pressure element 150, where the circulation flow is effected at least in sections by the pressure element 150, and a closed fluid circuit may be present. A temperature regulation for the object under examination may thus be realized advantageously.

In addition or as an alternative, a fluid circuit may also be created such that, if a specific pressure is attained in the pressure element 150 or on the object under examination O, the fluid circuit is interrupted, and only when a further variation in the pressure of the fluid FM in the pressure element 150 is required will the fluid circuit be restored.

In one embodiment, the pressure element 150 is not provided with fluid FM in a fluid circuit. For example, the fluid FM may be introduced in an initial step into the pressure element 150 with the aid of the fluid supply device 20. The fluid supply device may be detached from the local coil 100 and the pressure element 150. In addition, if required, the fluid FM may be drained out of the pressure element 150 due to an overpressure of the fluid FM in relation to the ambient pressure or may even be removed entirely without a closed fluid circuit being present. In other words, the fluid FM (e.g., air or water) is discharged directly into the surrounding environment. Optionally, an additional reservoir may also be provided for the pressure element 150 in order to remove the fluid FM from the pressure element 150, which, for example, with the fluid supply device 20 removed, accommodates the fluid FM drained out of the pressure element.

Both the fluid supply device 20 (e.g., with pump 23, cooler 22, and heater 23) and the optional reservoir may be configured as fully integrated into the local coil 100 (e.g., in the form of the micro diaphragm pump).

The fluid supply device 20 is actuated with the aid of a fluid control device 50 such that an optimum positioning of the object under examination O in the local coil may be provided. This may be done automatically on the basis of the profiles described heretofore, for example. In addition to this, the fluid control device may also take over a large number of regulating tasks, which are described in greater detail hereinafter. In addition to the automatic actuation of the pressure elements 150, however, simple embodiments of the local coil system 10, such as are described in greater detail, for example, in FIG. 3, may be provided.

Figure 3:
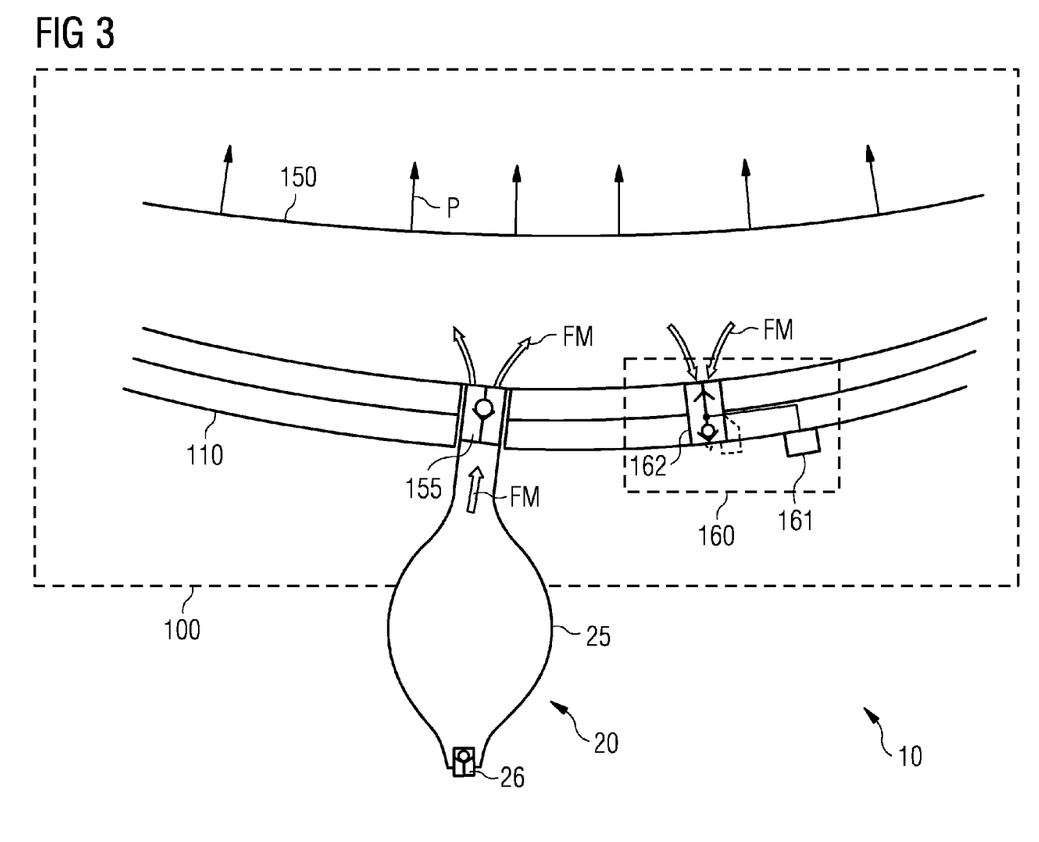
FIG. 3 shows a detailed section of one embodiment of a local coil system with a fluid supply device to be operated manually.

FIG. 3 shows an enlarged section from one embodiment of a local coil system 10 with a local coil 100 (only represented in part) and a fluid supply device 20 that, in this case, is formed by a bellows 25. The bellows 25 is configured such that the bellows 25 may be connected in a reversible detachable manner to a non-return valve 155 that is installed in order to deliver a fluid FM (e.g., ambient air) into a pressure element 150 for the conducting of a fluid, or the bellows 25 is connected to the pressure element 150. This provides, for example, that the actuator for the fluid supply (e.g., a non-return valve 155) is a constituent part of the pressure element 150. In this situation, when the bellows 25 are compressed, air is pressed through the non-return valve 155 into the pressure element 150. When the bellows 25 are released, the bellows 25 expand again and suck in new air via a further non-return valve 26 of the bellows 25.

The valve 155 may also be a constituent part of the fluid supply device 20. In other words, in this case, the valve 155 is integrated, for example, into the bellows 25. Access to the pressure element 150 for conducting the fluid FM may essentially be configured as open, without the bellows 25 being connected.

The non-return valve 155 may include, for example, an adjustment device that allows for a pressure limitation of the fluid FM inside the pressure element 150, such that the pressure P may be limited in relation to the object under examination.

The pressure element 150 includes a fluid drain device 160, or is at least partially connected to the fluid drain device 160. The fluid drain device 160 includes a rapid emptying valve 162 that is connected to a switch element 161. The switch element 161 controls the rapid emptying valve 162. As represented by a known switch symbol from fluid technology, the rapid emptying valve 162 is a valve that may be operated such that, by actuation of the switch element 161, an adequate (e.g., maximum) opening of the valve may be initiated. In this exemplary embodiment, the rapid emptying valve 162 is also configured such that, at a predetermined pressure of the fluid FM in the through-flow direction, the rapid emptying valve 162 allows a greater quantity of fluid FM to pass than the non-return valve 155.

Figure 4:
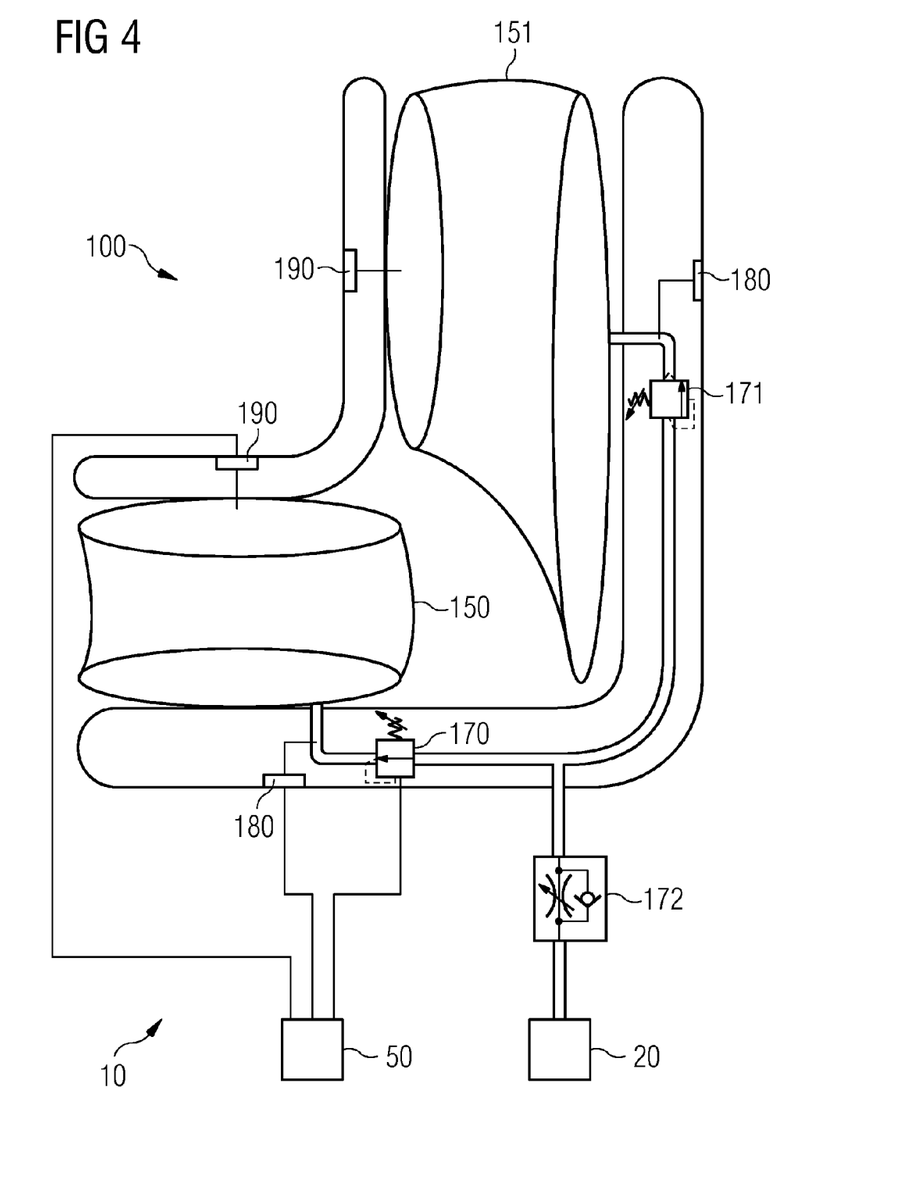
FIG. 4 shows an exemplary embodiment of a local coil system in cross-section, with a plurality of pressure elements, a plurality of pressure regulating devices, pressure sensors, and temperature sensors.

FIG. 4 shows a development of the local coil system 10, where the local coil 100 includes a plurality of pressure elements 150, 151 that may be filled with a fluid FM. In the exemplary embodiment shown, the local coil 100 is a coil for the ankle joint (e.g., a "Foot-Ankle-Coil"). The two pressure elements 150, 151 are connected to a common fluid supply device 20, where fluid supply lines run at least partially in the coil body 110. The local coil 100 is, for example, arranged such that the pressure of the fluid in the pressure elements 150, 151 may be adjusted differently from one another.

For this purpose, the pressure element 151 is connected to a pressure limiting valve 171 that is adjustable, such that a maximum pressure of the fluid in the pressure element 151 may be specified externally. The fluid supply device 20 delivers an essentially constant pressure of the fluid. In order to prevent too rapid a rise in the fluid pressure in the pressure elements, an optional choke non-return valve 172 is incorporated between the local coil 100 and the fluid supply device 20.

The fluid supply device 20 is configured so as to maintain the temperature of the fluid at a predetermined value. The temperature may be monitored, for example, by a temperature measuring device 190 that is connected to the pressure element 151. The pressure in the pressure element 151 may, for example, also be monitored. For this purpose, a pressure measuring device 180 that is connected to a fluid supply line is provided. The fluid supply line opens into the pressure element 151. As an alternative, the pressure measuring device 180 and the temperature measuring device 180, respectively, may also be connected directly to the pressure element.

The pressure measuring device 180 may include a sensor (e.g., a piezoelectric pressure sensor) for the monitoring. A display for displaying the pressure of the fluid in the pressure element 151 may also be provided as part of the pressure measuring device 180.

The temperature measuring device 190 may be configured in an analogous manner. As sensors, Seebeck-effect based sensors or, for example, resistance-based sensors such as platinum-based PT100, PT500 or PT1000 sensors may be used.

The pressure element 150 is also connected to the fluid supply device 20, where the delivery of the fluid takes place via a further fluid supply line that branches off the fluid supply line and runs at least partially inside the coil body 110 of the local coil. Installed in the delivery line is a pressure regulating valve 170 that is, for example, coupled to the fluid control device 50. In addition to this, the fluid control device 50 is also connected to a pressure measuring device 180 in the pressure element 150, such that the regulation of the pressure in the pressure element 150 may be provided on the basis of a target value with the aid of the fluid control device 50. In addition, the fluid control device 50 is also connected to a temperature measuring device 190. The fluid control device 50 may be arranged, for example, such that a constant inflow and outflow of the fluid takes place in the pressure element. For example, temperature regulation may thus also be provided with the aid of the control of the inflow and outflow. For this purpose, the temperature in the pressure element 150 may also be monitored by a temperature measuring device 190. In the local coil 100 represented, the pressure in the pressure elements 150 and 151, respectively, may be adjusted independently of one another, where, for example, the pressure in the pressure element 150 may be changed automatically. Accordingly, as is represented in FIG. 5, the position of an object under examination may be changed during a magnetic resonance recording sequence.

Figure 5:
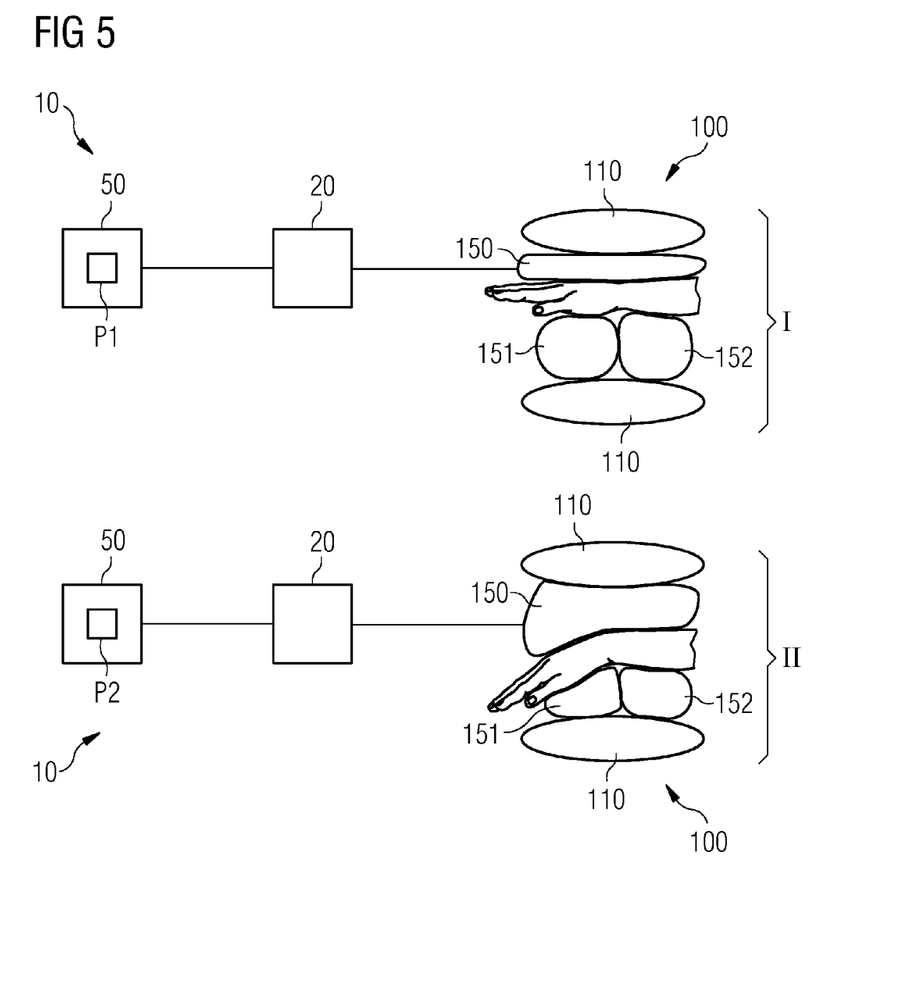
FIG. 5 shows an exemplary embodiment of a method for operation of a local coil system or a magnetic resonance imaging system.

FIG. 5 shows a local coil system 10 with a local coil 100, a fluid supply device 20, and a fluid control device 50 that, on the basis of a profile P1, at a first point in time during the acquisition of a magnetic resonance imaging, sets a first position I with the aid of pressure elements 150, 151, 152. In the exemplary embodiment represented, the object under examination O is a hand of a test subject, where the position of the wrist joint is held at a specific angle to the arm with the aid of the pressure elements 150, 151, 152. In the first position, for example, a pressure element 150, which is arranged on a first side of the object under examination O, is not filled with fluid or is filled with only a little fluid, such that the pressure element 150 in the first position I is essentially in a starting position.

By contrast, the pressure elements 151, 152 arranged on a side of the object under examination O that is opposite the pressure element 150 are in an end position. In other words, the pressure elements 151, 152 are filled with an almost maximum pressure of the fluid.

This configuration of the pressure elements 150, 151, 152 determines the first position I, for which magnetic resonance image data is generated in a magnetic resonance recording sequence.

In addition to this, in a second position II of the object under examination O, further magnetic resonance image data of the object under examination O is acquired. The change into the second position takes place fully automatically with the aid of the fluid control device 50, which, on the basis of a second profile P2, actuates the pressure elements 150, 151, 152 of the local coil 100 using the fluid supply device 20.

In the second position II, the pressure element 150, which is arranged on a first side of the object under examination O, is essentially in an end position (e.g., filled to a maximum pressure). Arranged on the opposite side of the object under examination are the pressure elements 151 and 152, which, by contrast with the pressure element 150, are filled with a fluid. The pressure element 151 is located essentially in a starting position (e.g., the fluid FM is essentially removed from the pressure element 151), while the pressure element 152 is operated in a position in which the pressure is less than the maximum pressure in the pressure element 152. In other words, an intermediate position is adopted. In the second position II described, the object under examination O adopts a position in the local coil that differs from the first position I. For example, the hand is angled at a different angle in relation to the forearm of the object under examination than in the first position I.

Due to the fact that now, with the aid of the fluid control device 50, defined relative positions of the object under examination O may be adjusted in relation to the local coil 100 or, respectively, in a measurement space of the magnetic resonance imaging system, predetermined positively-driven movement sequences of the object under examination O may be adjusted during a magnetic resonance recording sequence fully automatically. The magnetic resonance recordings generated may be used, for example, to be combined with a movement model, such that, from this, analyses may be derived regarding the functionality of the object under examination O.

Figure 6:
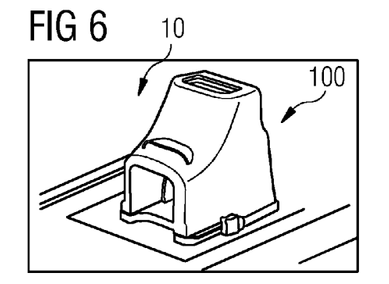
FIGS. 6 to 16 show example embodiments of local coils.
Figure 7:
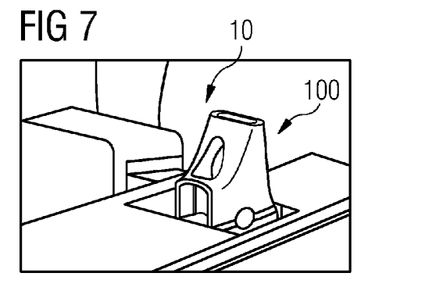
Figure 8:
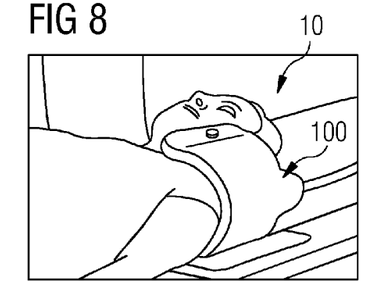
Figure 9:
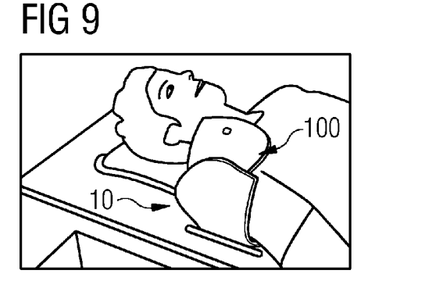
Figure 10:
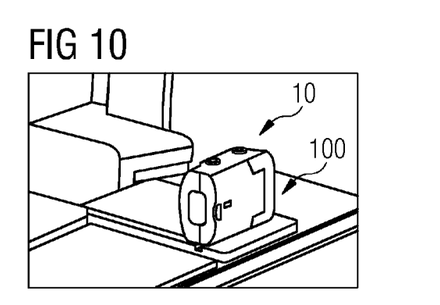
Figure 11:
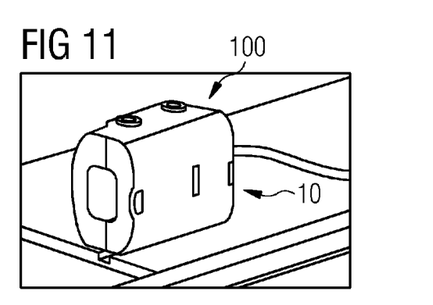
Figure 12:
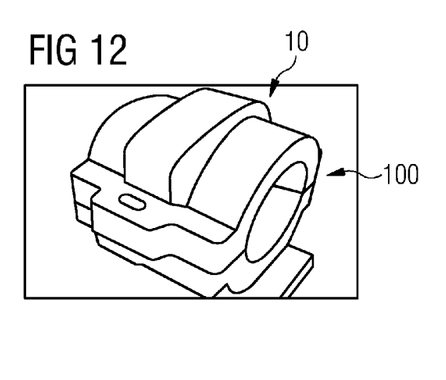
Figure 13:
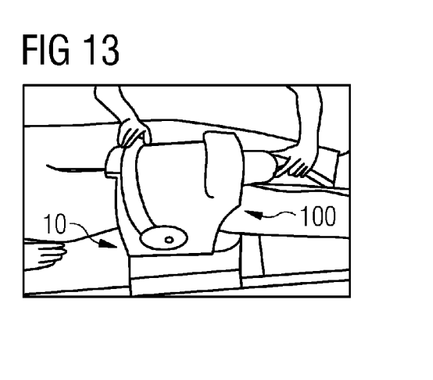
Figure 14:
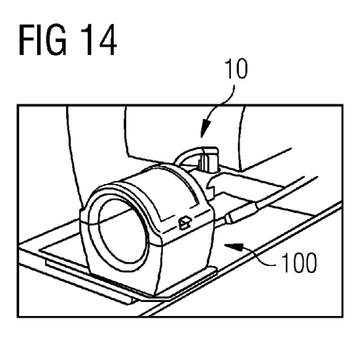
Figure 15:
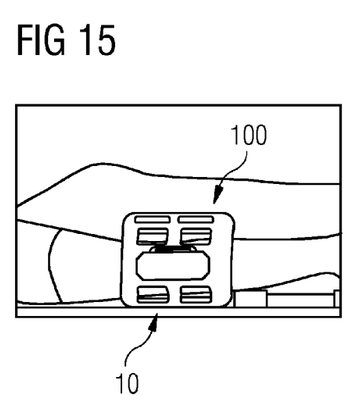
Figure 16:
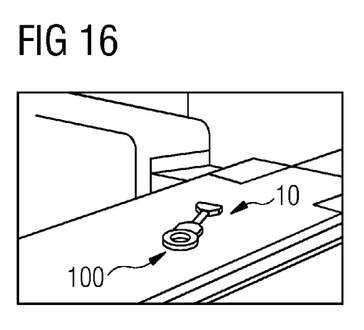

Suitable local coils 100 that may be combined with a pressure element are represented, for example, in FIGS. 6 to 16. The possible local coils 100 include ankle joint coils that are also designated as "Foot/Ankle Coils" (FIGS. 6 and 7). In addition to this, the pressure elements may also be coupled to local coils 100 for the recording of the region of the shoulder (FIGS. 8 and 9), which are referred to as "Shoulder Coils". The combination of a wrist joint coil, referred to as a "Wrist Coil", with one embodiment of a pressure element may also be provided (FIGS. 10 and 11). In one embodiment, the local coil 100 may also be a "Knee Coil" (FIGS. 12 and 13) or a local coil 100 for the recording of extremities of a test subject, such as, for example, an arm or a leg (FIGS. 14 and 15). These coils are designated as "Extremity Coils". In one embodiment, finger coils, referred to as "Small-Field-of-View-Finger-Joint" local coils may be combined with one or more pressure elements to create a local coil system 10 (FIG. 16).

One embodiment of the local coil 100 may be arranged for parallel image acquisition and, for example, includes one or more transfer channels that may also be operated in parallel.

The features of all the exemplary embodiments or developments disclosed in the figures may be used in any desired combination. The magnetic resonance imaging systems and local coils that have been described in detail heretofore are only exemplary embodiments that may be modified by the person skilled in the art in the most widely differing manners without leaving the scope of the invention. The use of the indefinite article "a" or "an" does not exclude the possibility that the features concerned may also be present in multiples. The terms "unit" or "module" do not exclude the possibility that the components concerned include several interacting part components that may also be spatially distributed and remote from one another.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil system for a magnetic resonance imaging system, the local coil system comprising:
   a local coil comprising a plurality of pressure elements, wherein each pressure element is fillable with a fluid; and
   a controllable fluid supply device that at least at an introduction of the local coil to an object under examination, during operation of the local coil, or a combination thereof is coupled to the plurality of pressure elements,
   wherein the local coil is configured such that a pressure of each pressure element attained with aid of the fluid, imposed on the object under examination, is changeable at least area by area, and
wherein the controllable fluid supply device is controllable so as to provide at least two different positions of the object under examination with aid of the plurality of pressure elements based on at least two different predetermined profiles.

2. The local coil system of claim 1, wherein the controllable fluid supply device is configured such that a filling pressure of the plurality of pressure elements during proper operation of the local coil is changeable.

3. The local coil system of claim 2, wherein the fluid is a gas or a liquid medium.

4. The local coil system of claim 2, wherein the local coil system is arranged so as to operate the plurality of pressure elements with different filling pressures.

5. The local coil system of claim 2, further comprising a fluid draining device, the fluid draining device operable to drain the fluid from the plurality of pressure elements.

6. The local coil system of claim 1, wherein the fluid is a gas or a liquid medium.

7. The local coil system of claim 6, wherein the fluid is air.

8. The local coil system of claim 1, wherein the local coil system is arranged so as to operate the plurality of pressure elements with different filling pressures.

9. The local coil system of claim 8, wherein substantially all of a surface of the local coil that, during the proper operation of the local coil, faces the object under examination, is covered by the plurality of pressure elements.

10. The local coil system of claim 1, wherein substantially all of a surface of the local coil that, during the proper operation of the local coil, faces the object under examination, is covered by the plurality of pressure elements.

11. The local coil system of claim 1, further comprising a fluid draining device, the fluid draining device operable to drain the fluid from the plurality of pressure elements.

12. The local coil system as claimed in claim 1, further comprising:
a pressure measuring device operable to measure a filling pressure of the plurality of pressure elements, operable to measure a pressure exerted with aid of the plurality of pressure elements onto the object under examination, or operable to measure the filling pressure of the plurality of pressure elements and the pressure exerted with the aid of the plurality of pressure elements.

13. The local coil system of claim 1,
wherein the fluid is an incompressible liquid medium.

14. A magnetic resonance imaging system comprising:
a local coil system comprising:
a local coil including a plurality of pressure elements that is fillable with a fluid; and
a controllable fluid supply device that at least at an introduction of the local coil to an object under examination, during operation of the local coil, or a combination thereof is coupled to the plurality of pressure elements,
wherein the local coil is configured such that a pressure of each pressure element attained with aid of the fluid, imposed on the object under examination, is changeable at least area by area, and
wherein the controllable fluid supply device is controllable so as to provide at least two different positions of the object under examination with aid of the plurality of pressure elements based on at least two different predetermined profiles.

15. The magnetic resonance imaging system of claim 14, further comprising a fluid control device operable to control, regulate, or control and regulate a pressure of the fluid in the local coil.

16. The magnetic resonance imaging system of claim 15, wherein the controllable fluid supply device is configured so as to allow for changing of a temperature of the fluid.

17. The magnetic resonance imaging system of claim 15, wherein the fluid control device is configured so as to choose between a plurality of different profiles with different regulating characteristics, controlling characteristics, or regulating characteristics and controlling characteristics for regulation, control, or regulation and control of a fluid supply of the local coil.

18. A method for generation of magnetic resonance images, the method comprising:
positioning a local coil relative to an object under examination, the local coil comprising a plurality of pressure elements, wherein each pressure element is fillable with a fluid;
supplying pressure to at least one pressure element of the plurality of pressure elements with the fluid, therein providing a first position of the object under examination;
generating a first magnetic resonance image of the object in the first position;
changing a pressure of at least one pressure element of the plurality of pressure elements attained by the fluid, at least area by area, therein providing a second position of the object under examination; and
generating a second magnetic resonance image of the object in the second position.

19. The method of claim 18, wherein the fluid is an incompressible liquid medium.

* * * * *